United States Patent
Saitoh et al.

(10) Patent No.: US 7,001,569 B2
(45) Date of Patent: Feb. 21, 2006

(54) METHOD OF MANUFACTURING CERAMIC MULTI-LAYER SUBSTRATE, AND UNBAKED COMPOSITE LAMINATED BODY

(75) Inventors: Yoshifumi Saitoh, Otsu (JP); Hiromichi Kawakami, Moriyama (JP)

(73) Assignee: Murata Manufacturing Co., Ltd., (JP)

(*) Notice: Subject to any disclaimer, the term of this patent is extended or adjusted under 35 U.S.C. 154(b) by 515 days.

(21) Appl. No.: 10/182,198

(22) PCT Filed: Nov. 22, 2001

(86) PCT No.: PCT/JP01/10200

§ 371 (c)(1),
(2), (4) Date: Jul. 26, 2002

(87) PCT Pub. No.: WO02/43455

PCT Pub. Date: May 30, 2002

(65) Prior Publication Data

US 2003/0008182 A1    Jan. 9, 2003

(30) Foreign Application Priority Data

Nov. 27, 2000 (JP) .......................... 2000-359026
Nov. 27, 2000 (JP) .......................... 2000-359027
Nov. 28, 2000 (JP) .......................... 2000-360582
Dec. 7, 2000 (JP) .......................... 2000-372262

(51) Int. Cl.
*C04B 37/00* (2006.01)
*B32B 15/00* (2006.01)

(52) U.S. Cl. .................. 264/672; 156/89.11
(58) Field of Classification Search ............ 264/642, 264/672, 678, 624; 156/89.11, 89.12, 89.16; 428/688

See application file for complete search history.

(56) References Cited

U.S. PATENT DOCUMENTS

| | | |
|---|---|---|
| 5,085,720 A | 2/1992 | Mikeska et al. |
| 5,387,474 A | 2/1995 | Mikeska et al. |
| 6,395,118 B1 * | 5/2002 | Sakamoto et al. ....... 156/89.12 |

FOREIGN PATENT DOCUMENTS

JP      7-86743 A      3/1995

(Continued)

OTHER PUBLICATIONS

Machine translation of JP 2000-176928 (printed Feb. 16, 2005).*

*Primary Examiner*—Dionne A. Walls
*Assistant Examiner*—Carmen Lyles-Irving
(74) *Attorney, Agent, or Firm*—Dickstein, Shapiro, Morin & Oshinsky, LLP.

(57) ABSTRACT

A method of producing a ceramic multilayer substrate involves: producing a green composite laminate 11 containing first and second shrink-suppressing layers formed on the main surfaces of a green multilayer mother substrate 12 containing ceramic powder, the first and second shrink-suppressing layers containing a sintering-difficult powder substantially incapable of being sintered under the sintering conditions for the ceramic powder; forming first grooves 16 extending from the first shrink-suppressing layer 13 side into a part of the multilayer mother substrate 12; firing the composite laminate 11; removing the first and second shrink-suppressing layers 13 and 14; dividing the multilayer mother substrate 12 along the grooves 16 and obtaining a plurality of the ceramic multilayer substrates. Thereby, shrinkage in the plan direction at firing can be suppressed. Thus, a ceramic multilayer substrate having a high dimensional accuracy and a high reliability can be produced with a high production efficiency.

20 Claims, 12 Drawing Sheets

FOREIGN PATENT DOCUMENTS

| | | |
|---|---|---|
| JP | 7-99263 | 4/1995 |
| JP | 7-240571 A | 9/1995 |
| JP | 10-75060 A | 3/1998 |
| JP | 11-54886 A | 2/1999 |
| JP | 2000176928 * | 6/2000 |
| JP | 2000-315841 A | 11/2000 |

* cited by examiner

PRIOR ART

METHOD OF MANUFACTURING CERAMIC MULTI-LAYER SUBSTRATE, AND UNBAKED COMPOSITE LAMINATED BODY

This application is a 371 of PCT/JP01/10200, filed on Nov. 22, 2001.

TECHNICAL FIELD

The present invention relates to a method of producing ceramic multilayer substrates and a green composite laminate, and more particularly to a method of producing ceramic multilayer substrates which aims at suppressing deformation at firing, and a green composite laminate which is produced in the method.

BACKGROUND ART

Recent years, the performances of electronic parts in the electronics fields have been remarkably enhanced. This contributes to the enhancement of the information-processing speed of information processing units such as large scale computers, mobile communication terminals, personal computers, and so forth, the reduction in size thereof, and the realization of the multi-functions thereof. As one of these electronic parts, a multi-chip module (MCM) is exemplified in which a plurality of semiconductor devices such as VLSI, ULSI, and so forth are mounted onto ceramic substrates. In such a module, a ceramic multilayer substrate having wiring-conductors three-dimensionally arranged is often used.

The ceramic multilayer substrate is produced by firing a green multilayer mother substrate which are formed by laminating a plurality of ceramic green sheets. However, when the green multilayer mother substrate is fired by an ordinary technique, the multilayer mother substrate is shrunk in the main surface direction and in the thickness direction. Especially, this causes a dimensional error of about 0.4 to 0.6% in the main surface direction. Then, in some cases, the positional accuracies of external conductors are deteriorated, and internal conductors are deformed, distorted, or disconnected.

Accordingly, Japanese Unexamined Patent Application Publication No. 4-243978 proposes a method of producing a ceramic multilayer substrate as described below.

First, glass ceramic power capable of being sintered at a temperature of up to 1000° C., and alumina powder which can not be sintered at the sintering temperature of the glass ceramic powder are prepared. Subsequently, ceramic green sheets containing glass ceramic powder are laminated Shrink-suppressing layers containing alumina powder are arranged so as to sandwich the green multilayer substrate to produce a green composite laminate.

Subsequently, the above-described composite laminate is fired under the sintering conditions for the glass ceramic powder and the alumina powder contained in the shrink-suppressing layers is not substantially sintered. Thus, the shrink suppressing layers are not substantially shrunk. According to this action, the shrink-suppressing layers constrain the green multilayer substrate. The multilayer substrate is shrunk only in the thickness direction, and the shrinkage in the main surface direction is suppressed. Thereafter, the shrink-suppressing layers are removed by a proper means to obtain the ceramic multilayer substrate.

The ceramic multilayer substrate obtained by the above-described so-called non-shrink process has a high dimensional precision in the major plane direction, and has a high reliability, exhibiting less warp and distortion.

Moreover, to efficiently produce the ceramic multilayer substrate, the following method is adopted. That is, a plurality of ceramic multilayer substrates are combined to form a multilayer mother substrate. The multilayer mother substrate is divided along predetermined dividing lines, so that a plurality of the ceramic multilayer substrates are obtained at once.

To divide the multilayer mother substrate as described above, grooves are provided along the predetermined diving lines on the major surface. Thereby, the multilayer mother substrate can be easily divided.

The grooves are ordinarily formed on the major surface of the green multilayer mother substrate by means of a cutter knife, a mould, or the like. In the case in which the ceramic multilayer substrate is produced using the shrink suppressing layers as described above, the grooves are formed as described in Japanese Unexamined Patent Application Publication No. 7-99263 and shown in FIG. 12.

FIG. 12 shows a cross-sectional view showing a part of a green composite laminate 101 comprising a green multilayer mother substrate 102, and a first shrink-suppressing layer 103 and a second shrink-suppressing layer 104 arranged so as to sandwich the substrate 102. In FIG. 12, a wiring conductor provided for the multilayer mother substrate 102 is omitted, and the size in the thickness direction is magnified.

In FIG. 12, the green multilayer mother substrate 102 comprises a plurality of ceramic green sheets 107 containing glass ceramic powder. The first shrink-suppressing layer 103 and the second shrink-suppressing layer 104 are formed by laminating a predetermined number of green sheets 108 containing sintering-difficult powder incapable of being sintered at the sintering temperature of the above-described glass ceramic powder, such as alumina powder or the like.

The green composite laminate 101 is produced as follows.

First, the ceramic green sheets containing glass ceramic powder are laminated, and pressed in the lamination direction to obtain the green multilayer mother substrate 102 containing a plurality of the ceramic green sheets 107. Thereafter, grooves 106 are formed on one main surface of the green multilayer mother substrate 102.

Subsequently, the green sheets 108 containing the alumina powder are laminated so as to sandwich the green multilayer mother substrate 102, whereby the first shrink-suppressing layer 103 and the second shrink-suppressing layer 104 are formed. Thus, the green composite laminate 101 is obtained. Thereafter, the green composite laminate 101 is pressed again, and fired at a temperature at which the glass ceramic powder contained in the ceramic green sheets 107 can be sintered.

Thereafter, the green first shrink-suppressing layer 103 and the green second shrink-suppressing layer 104 which are not sintered substantially in the above-described firing process are removed. Thus, the fired multilayer mother substrate 102 having the grooves 106 is obtained. The fired multilayer mother substrate 102 is divided along the grooves 106, and the individual ceramic multilayer substrates are obtained.

As described above, when the grooves 106 are formed on the green multilayer mother substrate 102, a plurality of the laminated ceramic green sheets need to be sufficiently pressed beforehand, so that the respective ceramic green sheets 107 are not shifted when the grooves are formed.

However, when the green composite laminate 101 is pressed again, it is difficult to obtain sufficient adhesion strengths between the green multilayer mother substrate 102 which have been already pressed and the first shrink-suppressing layer 103 and the second shrink-suppressing layer 104 which have not been pressed yet. As a result, the constraining forces of the first shrink-suppressing layer 103 and the second shrink-suppressing layer 104 for the ceramic green sheets 107 are small. Thus causes problems in that the shrinkage of the ceramic green sheets 107, that is, the shrinkage in the plane direction of the green multilayer mother substrate 102 can not be sufficiently prevented.

Moreover, inview constituting the multilayer mother substrate and the green sheets 108 constituting the respective shrink-suppressing layers, a process of forming the grooves 106, which is different from the laminating process, is carried Out. Thus, problematically, the production efficiency is reduced.

In view of the foregoing, the present invention has been devised. An object of the present invention is to provide a method of producing a ceramic multilayer substrate by which a ceramic multilayer substrate can be produced at a high production efficiency, and a green composite laminate obtained in the production process.

DISCLOSURE OF INVENTION

That is, the present invention relates to a method of producing ceramic multilayer substrates comprising the steps of: (1) as a first step, producing a green composite laminate containing first and second shrink-suppressing layers formed on one main surface and the other main surface of a green multilayer mother substrate comprising a plurality of ceramic green layers containing ceramic powder, the first and second shrink-suppressing layers containing a sintering-difficulty powder substantially incapable of being sintered under the sintering conditions for the ceramic powder, (2) as a second step, forming first grooves extending from the first shrink-suppressing layer to pass through the first shrink-suppressing layer and reach a part of the green multilayer mother substrate, (3) as a third step, firing the green composite laminate under the sintering conditions for the ceramic powder, (4) as a fourth step, removing the first and second shrink-suppressing layers to realize the sintered multilayer mother substrate, and (5) as a fourth step, dividing the multilayer mother substrate along the first grooves, and realizing a plurality of the ceramic multilayer substrates.

According to the present invention, for the composite laminate comprising the first shrink-suppressing layer, the multilayer mother substrate, and the second shrink-suppressing layer which are laminated together in the above-described non-shrink process, the first grooves are formed from the first shrink-suppressing layer side so as to pass through the first shrink-suppressing layer and reach a part of the composite laminate are formed. Thus, a ceramic multilayer substrate having high dimensional accuracy and reliability can be produced with a high production efficiency.

Moreover, the present invention relates to a green composite laminate comprising a green multilayer mother substrate formed by laminating a plurality of ceramic green layers containing ceramic powder, and first and second shrink-suppressing layers formed on one main surface and the other main surface of the multilayer mother substrate and containing a sintering-difficulty powder substantially incapable of being sintered under the sintering conditions for the ceramic powder, first grooves being formed from the first shrink-suppressing layer side so as to pass through the first shrink-suppressing layer and reach a part of the multilayer mother substrate.

According to the present invention, the above-described method of producing a ceramic multilayer substrate of the present invention can be carried out with high reproducibility.

BEST MODE FOR CARRYING OUT THE INVENTION

<First Embodiment>

Figure 1:
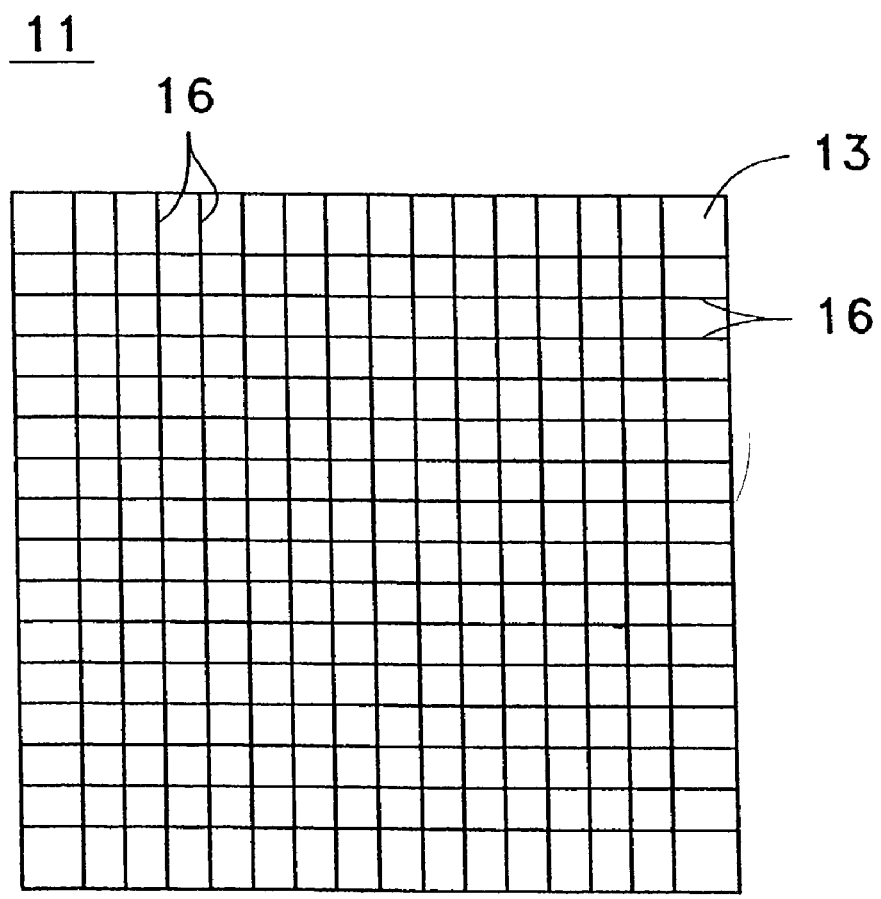
FIG. 1 is a plan view of a green composite laminate 11 according to a first embodiment of the present invention.
Figure 2:
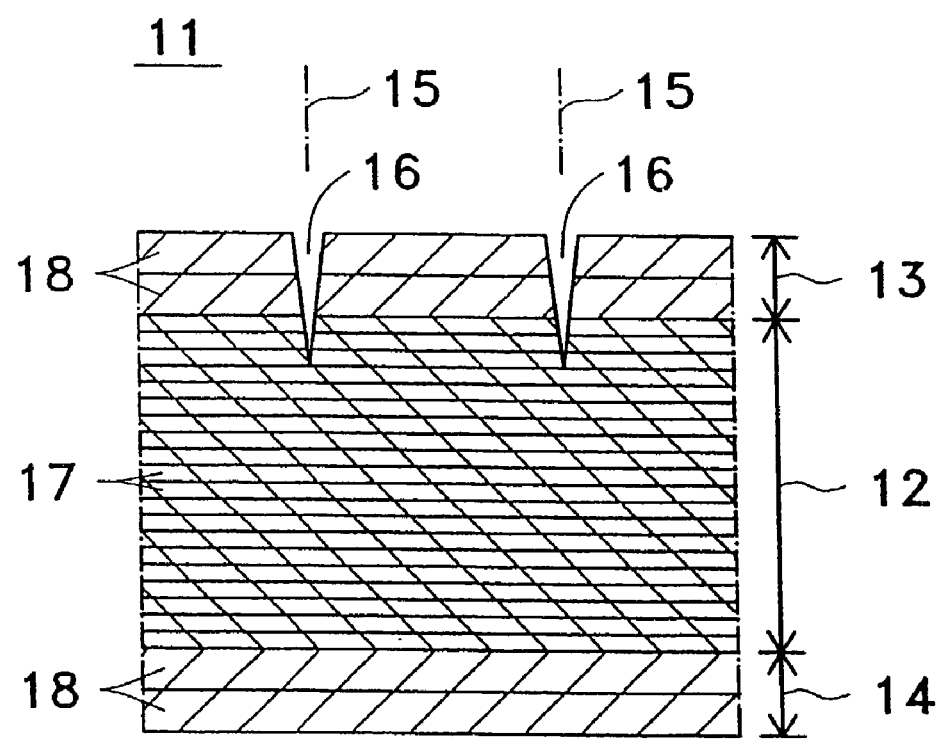
FIG. 2 is a partially enlarged cross-sectional view of the green composite laminate 11 according t the first embodiment of the present invention.

FIGS. 1 and 2 are illustrations of a first embodiment of the present invention, showing a green composite laminate 11 which is obtained in the process of producing a ceramic multilayer substrate. Here, FIG. 1 is a plan view of the green composite laminate 11. FIG. 2 is a partially enlarged cross-sectional view of the green composite laminate 11 shown in FIG. 1. In FIGS. 1 and 2, wiring conductors are not depicted, and the size in the thickness direction thereof is exaggerated. In FIGS. 1 and 2, it is assumed that wiring conductors are arranged at a substantially equal density in the thickness direction of the multilayer mother substrate 12. Moreover, in FIG. 1, the shape viewed in the plan of the green composite laminate 11 is square. However, it may be rectangular.

The green composite laminate 11 comprises the green multilayer mother substrate 12, a first shrink-suppressing layer 13, and a second shrink-suppressing layer 14 arranged so as to sandwich the substrate 12. First grooves 16 are formed along dividing lines 15 on the green composite laminate 11.

The green multilayer mother substrate 12 comprises a plurality of laminated ceramic green layers 17. For example, the ceramic green layers 17 may be ones of a thick-film type, produced using ceramic paste. Preferably, the ceramic green layers 17 are made of ceramic green sheets.

The ceramic green sheet is obtained, for example, by adding a binder, a plasticizer, a solvent, and so forth to ceramic powder, mixing them by means of a ball mill, an attractor, or the like to prepare slurry, forming the slurry into a sheet by means of a doctor blade or the like.

As the ceramic powder, ceramic powders for use in conventional ceramic multilayer substrates, preferably, glass ceramic powder, can be employed. For example, ceramic powders containing alumina borosilicate glass, noncrystalline glass having a softening point of 600° C. to 800° C., crystallized glass having a crystallization temperature of 600° C. to 1000° C., or the like may be used. Moreover, alumina, zirconia, mullite, cordierite, anauxite, silica, and so forth may be added to the ceramic powders to be used.

As the binder, for example, polyvinylbutyral, methacryl polymers, acryl polymers, and so forth may be used. As the plasticizer, for example, derivatives of phthalic acid or the like may be employed. As the solvent, for example, alcohols, ketones, chlorine-containing organic solvents, and so forth may be used.

The ceramic green sheet is cut in a predetermined size to be used. The thickness of the ceramic green sheet has no particular limits. Preferably, the thickness is in the range of 25 $\mu$m to 200 $\mu$m. Moreover, wiring conductors may be formed by screen-printing electroconductive paste on the ceramic green sheet, if necessary. Furthermore, via-hole conductors may be provided by forming perforations for via-hole conductors in the ceramic green sheet, and filling conductive paste into the perforations. For the wiring conductors and the via-hole conductors, metal materials having a small resistivity and excellent high frequency characteristics such as gold, silver, copper, and so forth can be used.

Preferably, the first shrink-suppressing layer 13 and the second shrink-suppressing layer 14 comprise of a plurality of green sheets 18 laminated to each other, respectively. Each green sheet 18 contains a sintering-difficult powder which can not be sintered at the sintering temperature for the ceramic powder contained in the ceramic green layers 17. As the sintering-difficult powder, for example, when the sintering temperature of the ceramic powder contained in the ceramic green layers 17 is up to 1100° C., inorganic powders of alumina, zirconia, aluminum nitride, boron nitride, mullite, magnesium oxide, silicon carbide, or the like may be used. For the purpose of preventing the surface of the sintered ceramic multilayer substrate from being roughed, preferably, the average particle size of the sintering-difficult powder is in the range of about 0.5 $\mu$m to 4 $\mu$m. It is to be noted that sintering-difficult powders having substantially the same average particle sizes are used in the first shrink-suppressing layer 13 and the second shrink-suppressing layer 14 in the green composite laminate 11 shown in FIG. 1.

The method of producing the green sheet 18 is the same as that of producing the ceramic green sheet to form the ceramic green layers 17. The thickness of the green sheet 18 has no particular limits, and preferably is in the range of 25 $\mu$m to 200 $\mu$m.

Hereinafter, the method of producing a ceramic multilayer substrate in accordance with the present invention will be described in detail.

(First Process)

First, ceramic green sheets which are to form a multilayer mother substrate are laminated. Thus, the green multilayer mother substrate 12 is produced which comprises a plurality of the ceramic green layers 17 laminated to each other.

Subsequently, the green sheets 18 are laminated so as to sandwich the green multilayer mother substrate 12. Thus, the first shrink-suppressing layer 13 and the second shrink-suppressing layer 14 are arranged on one main surface and the other main surface of the multilayer mother substrate 12, respectively, to form the green composite laminate 11. The thickness of the first shrink-suppressing layer 13 is substantially equal to that of the second shrink-suppressing layer 14 in the green composite laminate 11 shown in FIG. 1.

Subsequently, the whole of the green composite laminate 11 is pressed at a predetermined pressure in the lamination direction of the ceramic green layers 17, so that the first shrink-suppressing layer 13, the green multilayer mother substrate 12, and the first shrink-suppressing layer 13 adhere to each other. As the pressing conditions, for example, a plan pressure of 30 MPa to 200 MPa and a temperature of 40° C. to 90° C. are employed.

(Second Process)

Next, the first grooves 16 are formed along the dividing lines 15 in the green composite laminate 11, as shown in FIG. 2. In this embodiment, as shown in FIG. 1, the first grooves 16 are formed in a grating pattern. The first grooves 16 can be easily formed by pushing a cutter knife against the surface of the green composite laminate 11, or cutting into the laminate 11 with a rotary blade.

At this time, the first grooves 16 are formed so as to pass through the first shrink-suppressing layer 13 from the first shrink-suppressing layer 13 side and reach a part of the green multilayer mother substrate 12. For example, the first grooves 16 are formed so as to have a thickness equal to about $\frac{1}{10}$ to $\frac{4}{10}$ of that of the green multilayer mother substrate 12.

In FIG. 2, the cross-section of each first notch 16 has a V-character shape. For example, the first notch 16 may have another cross-section such as a U-character shape.

(Third Process)

Subsequently, the green composite laminate 11 is fired in such firing conditions that the ceramic powder contained in the ceramic green layers 17 can be sintered, but the sintering-difficult powder contained in the first shrink-suppressing layer 13 and the second shrink-suppressing layer 14 can not be sintered substantially. Moreover, preferably, the green composite laminate 11 is placed, e.g., on an alumina plate to be fired. At this time, by using an alumina plate having a high porosity, the gas permeability is increased, so that the binder-removing property is enhanced.

Since the sintering-difficult powder contained in the first shrink-suppressing layer 13 and the second shrink-suppressing layers 14 are not sintered substantially, the first shrink-suppressing layer 13 and the second shrink-suppressing layer 14 are not shrunk in the main surface direction substantially. Accordingly, the multilayer mother substrate 12 can be suppressed from undesirably shrinking in the main surface direction, due to the shrink-suppressing action of the first and second shrink-suppressing layers 13 and 14. As a result, irregular deformation such as warp, distortion, and so forth is inhibited in the sintered multilayer mother substrate 12. Moreover, shrinking errors, caused by the firing-shrinking, can be reduced.

(Fourth Process)

Subsequently, the first shrink-suppressing layer 13 and the second shrink-suppressing layers 14 are removed from the sintered composite laminate 11 by an appropriate means. Thus, the sintered multilayer mother substrate 12 is obtained. As the means for removing the respective shrink-suppressing layers, for example, wiping off using a brush, sand blasting, wet blasting, and so forth are exemplified. The respective shrink-suppressing layers are not sintered substantially and are in the porous state, so that they can be easily removed.

(Fifth Process)

Then, the sintered multilayer mother substrate 12 is divided along the first grooves 16, so that the individual ceramic multilayer substrates are obtained.

According to the above-described technique, the whole of the above-described composite laminate can be pressed. Thus, sufficient adhesion strengths between the first shrink-suppressing layers 13, the second shrink-suppressing layer 14, and the multilayer mother substrate 12 can be obtained. Thus, a satisfactory constraining force can be applied for the multilayer mother substrate. In addition, the first grooves are formed in the composite laminate after the lamination. Thus, the first grooves do not need to be formed during the process in which the ceramic green sheets for constituting the multilayer mother substrate and the green sheets for constituting the respective shrink-suppressing layers are laminated. Therefore, the production efficiency is enhanced.

<Second Embodiment>

Figure 3:
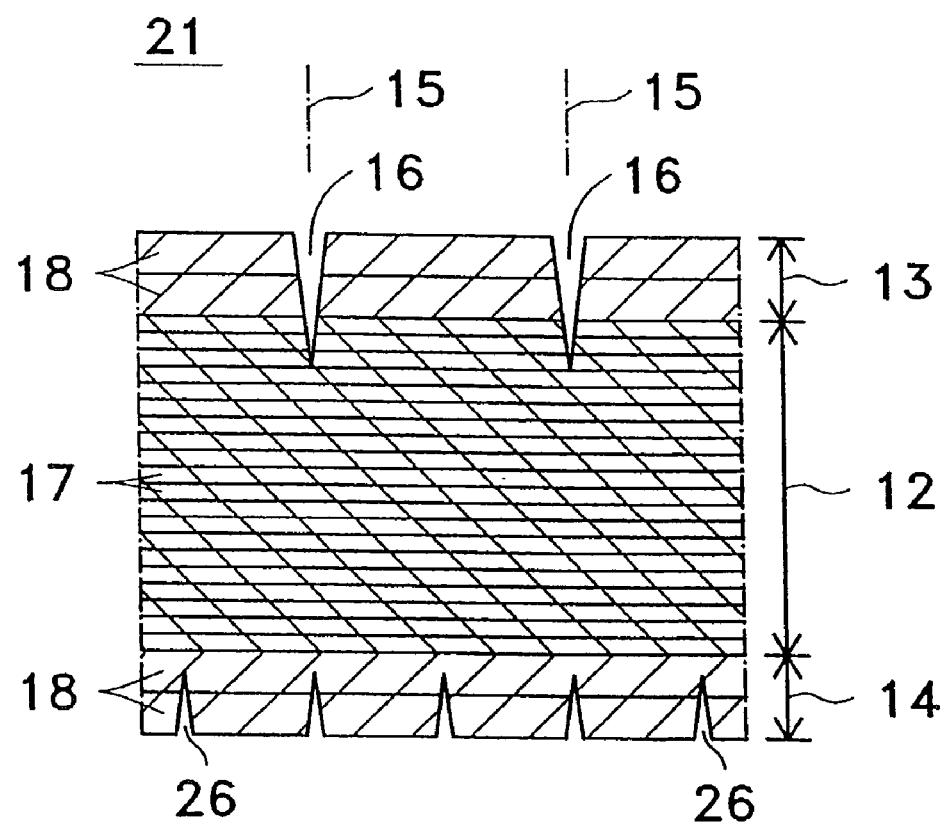
FIG. 3 is a partially enlarged cross-sectional view of a green composite laminate 21 according to a second embodiment of the present invention.

FIG. 3 illustrates a second embodiment of the present invention.

Basically, a green composite laminate 21 of this embodiment is the same as that of the first embodiment of the present invention excepting that second grooves 26 are formed so as to extend from the second shrink-suppressing layer 14 side. The second grooves 26 can be formed in the second process. The formation of the second grooves 26 may be performed before or after the formation of the first grooves 16. The second grooves 26 are formed in a grating pattern as well as the first grooves 16, although not shown in FIG. 3. The method of forming the second grooves is the same as that employed in the first embodiment, and the description is omitted.

The second grooves 26 are formed in such a manner that the top points thereof lie in the second shrink-suppressing layers 14. Moreover, in this embodiment, the second grooves 26 are formed in a number higher than that of the first grooves 16. Thereby, the constraining forces of the first shrink-suppressing layer 13 and the second shrink-suppressing layer 14 can be balanced with each other. Thus, a desired constraining force for the multilayer mother substrate 12, in other words, a desired shrink-suppressing force can be applied.

With respect to the above-description, the following is supposed. In the green composite laminate 11 shown in FIG. 2, the shrink-degree in the vicinity of the first grooves 16 become slightly larger than that in the other part thereof. Thus, the shrinking force on the one main surface side of the multilayer mother substrate 12 become larger than that on the other main surface side thereof. Therefore, the multilayer mother substrate 12 is warped into a concave shape.

The warping of the multilayer mother substrate 12 into a concave shape, as described above, means that the one main surface of the multilayer mother substrate 12, that is, the surface thereof having the first grooves 16 formed therein is distorted so as to be depressed.

For example, when the density of formed wiring conductors on one main surface side of the multilayer mother substrate 12 is different from that on the other main surface side thereof, or when the multilayer mother substrate is formed by laminating different types of ceramic green layers, the multilayer mother substrate 12 is ready to suffer deformation such as warp, distortion, and so fourth This is caused more remarkably, as the area of the multilayer mother substrate 12 is increased.

According to this embodiment, the depths and the number of the second grooves 26 can be adjusted based on those of the first grooves 16 in order to reduce the deformation of the multilayer mother substrate 12 to become as small as possible. For example, when the first grooves 16 are deeper than the second grooves 26 as shown in FIG. 3, the multilayer mother substrate 12 tends to be warped into a concave shape. Thus, the warping thereof into the concave shape can be decreased by forming a greater number of the second grooves 26 than the first grooves 16.

In this embodiment, the second grooves 26 are formed in such a manner that the top points thereof lies in the second shrink-suppressing layer. Therefore, the second grooves 26 can be formed at optional positions, that is, irrespective of the positions of the dividing lines 15, provided that the positions are appropriate for suppression of the warp.

<Third Embodiment>

Figure 4:
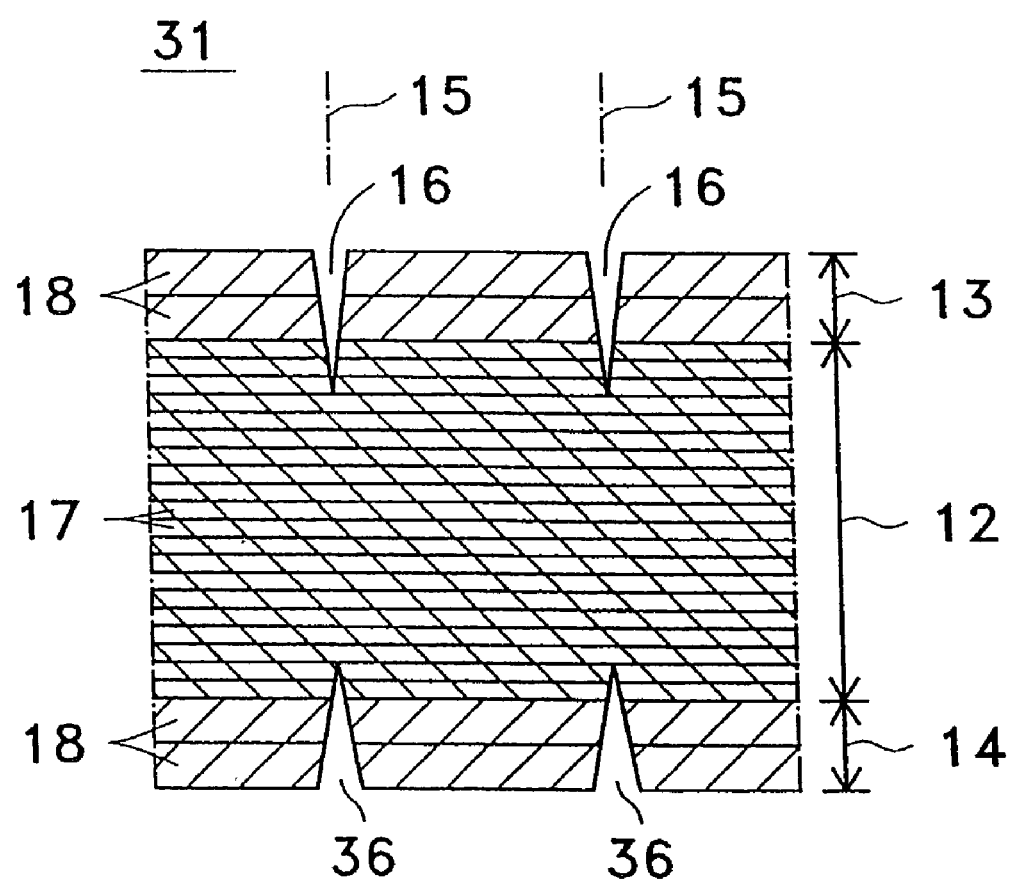
FIG. 4 is a partially enlarged cross-sectional view of a green composite laminate 31 according to a third embodiment of the present invention.

FIG. 4 illustrates a third embodiment of the present invention.

Basically, this embodiment is the same as the above-described first embodiment excepting that a green composite laminate 31 further has second grooves 36 formed extending from the second shrink-suppressing layer 14 side. The second grooves 36 are formed so as to pass through the second shrink-suppressing layer 14 and reach a part of the multilayer mother substrate 12. Moreover, the second grooves 36 are formed along the dividing lines 15 in the positions opposite to the first grooves 16 with respect to the multilayer mother substrate 12. Moreover, the depth of the second grooves 36 is the same as that of the first grooves 16.

The second grooves 36 can be formed in the second process. The second grooves 26 may be formed before or after the formation of the first grooves 16. The method of forming the second grooves is the same as that employed in the first embodiment, and the description is omitted.

According to this embodiment, the second grooves 36 act so as to suppress the multilayer mother substrate 12 from warping into a concave shape. Moreover, since the second grooves 36 are formed opposite to the first grooves 16, the sintered multilayer mother substrate 12 can be divided more easily. Thus, the ceramic multilayer substrates can be efficiently taken out.

<Fourth Embodiment>

Figure 5:
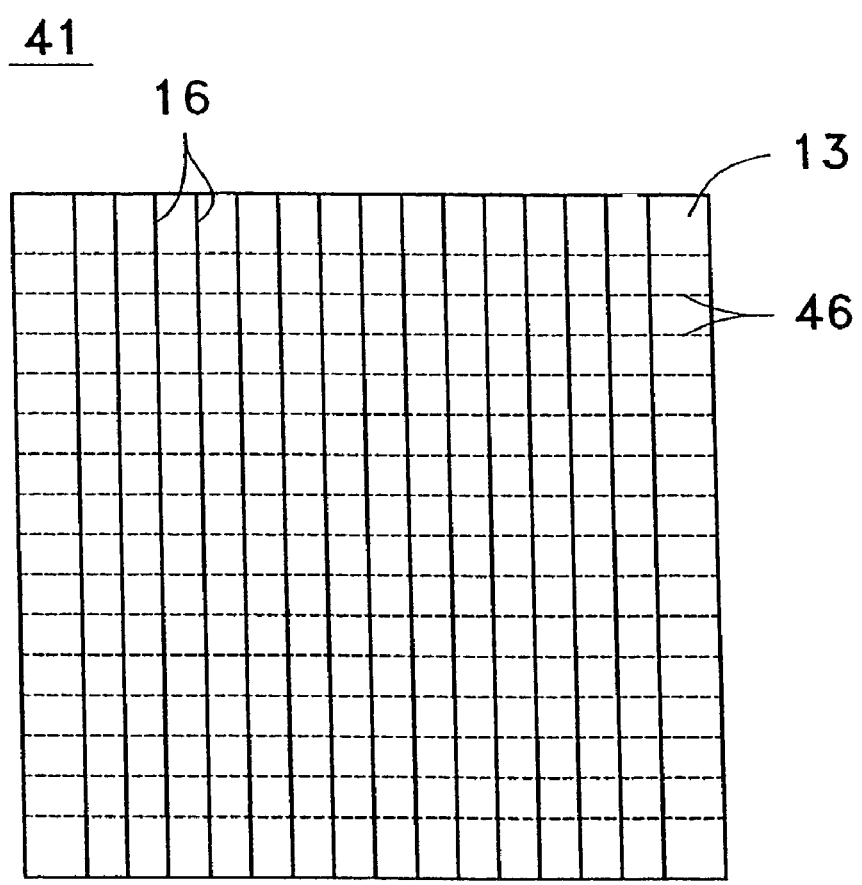
FIG. 5 is a partially enlarged cross-sectional view of a green composite laminate 41 according to a fourth embodiment of the present invention.

FIG. 5 illustrates a fourth embodiment of the present invention.

Basically, this embodiment is the same as the above-described first embodiment, excepting that a green composite laminate 41 has the first grooves 16 on one main surface side of the multilayer mother substrate, shown by the solid lines in the longitudinal direction in the drawing, and has second grooves 46 on the other main surface side thereof, shown by the broken lines in the lateral direction in the drawing.

The second grooves 46 are formed so as to pass through the second shrink-suppressing layer 14 and reach a part of the multilayer mother substrate 12. That is, the sintered multilayer mother substrate 12 has the first grooves on the one main surface in the longitudinal direction, and has the second grooves on the other main surface in the lateral direction. Namely, when the substrate 12 is viewed in the plan thereof, the second grooves 46 are formed so as to cross at a right angle with respect to the first grooves 16.

The second grooves 46 can be formed in the second process. The second grooves 26 may be formed before or after the formation of the first grooves 16. The method of producing the second grooves is the same as that employed in the first embodiment, and the description is omitted.

In the green composite laminate 11 shown in FIG. 1, the following is supposed. Since the constraining force becomes weaker in the vicinity of grooves 16 of the first shrink-suppressing layer than that in the other part of the laminate 11, the multilayer mother substrate 12 is warped into a concave shape. The second grooves 46 formed in the second shrink-suppressing layer can suppress the above-described warp, and simultaneously can make it easy to divide the sintered multilayer mother substrate 12.

<Fifth Embodiment>

Figure 6:
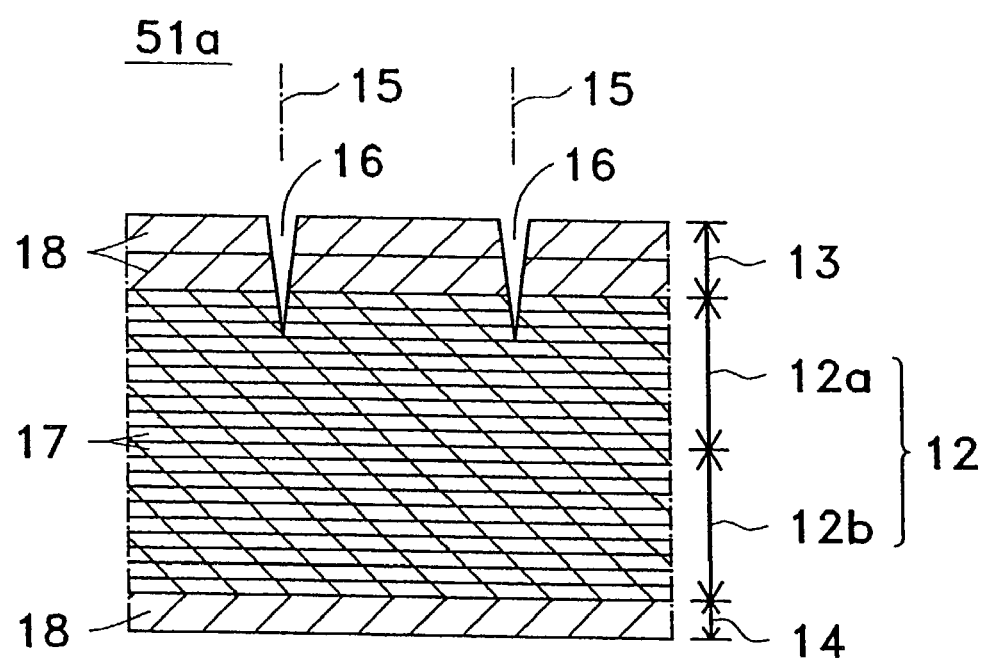
FIG. 6 is a partially enlarged cross-sectional view of a green composite laminate 51a according to a fifth embodiment of the present invention.
Figure 7:
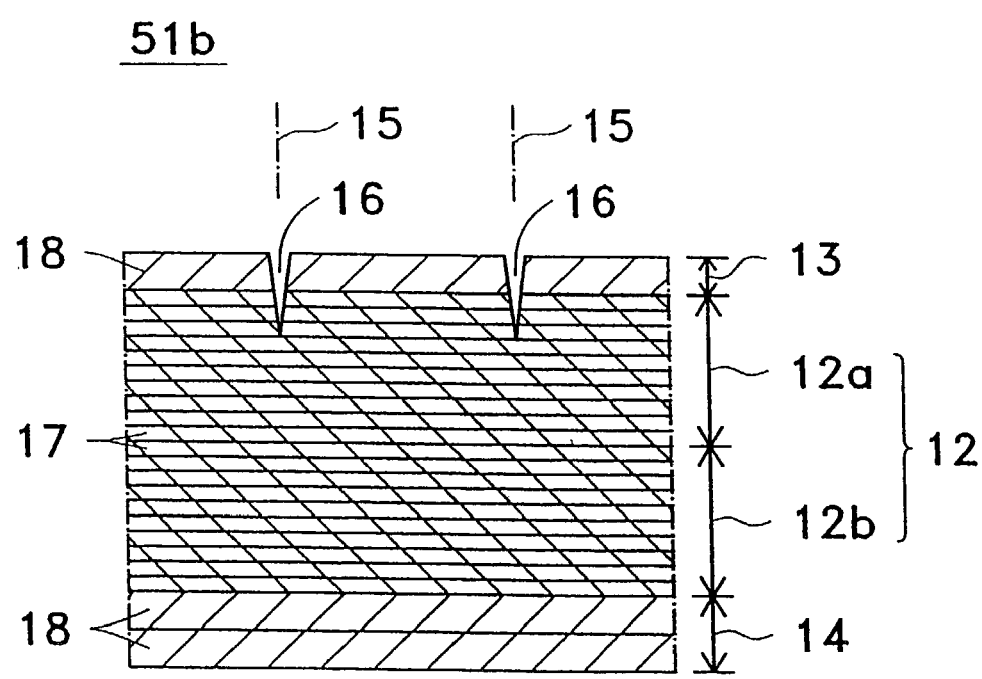
FIG. 7 is a partially enlarged cross sectional view of a green composite laminate 51b according to a fifth embodiment of the present invention.

FIGS. 6 and 7 illustrate a fifth embodiment of the present invention.

Basically, a green composite laminate 51a of this embodiment is the same as the above-described first embodiment, excepting that the first shrink-suppressing layer 13 and the second shrink-suppressing layer 14 are formed so as to have different thicknesses. Moreover, although not in the drawing, wiring conductors are arranged on one main surface side 12a of the multilayer mother substrate 12 substantially at the same density as or at a higher density than those provided on the other main surface side 12b thereof.

When wiring conductors are arranged on the one main surface side 12a of the multilayer mother substrate 12 substantially at the same density as those on the other main surface side 12b, the constraining force by the first shrink-suppressing layer becomes lower correspondingly to the first grooves formed in the first shrink-suppressing layer. Thus, the multilayer mother substrate 12 is ready to be warped into a concave shape. Accordingly, as shown in FIG. 6, the thickness of the first shrink-suppressing layer 13 is set to be larger than that of the second shrink-suppressing layer 14 to enhance the stiffness of the first shrink-suppressing layer 13. Thereby, the above-described warp can be suppressed.

Moreover, when wiring conductors are arranged on the one main surface side 12a of the multilayer mother substrate 12 at a higher density than those on the other main surface side 12b thereof, the multilayer mother substrate 12 is ready to be warped into a concave shape. The reason for the warping lies in that the shrink start temperature of the wiring conductors is lower than that of the ceramic green layers 17, so that the wiring conductors are shrunk stretching the ceramic green layers 17 in the vicinity of the wiring conductors, and thus, the shrink degree on the one main surface side 12a having a higher wiring density becomes larger than that on the other main surface side 12b. Accordingly, the warp can be suppressed by setting the thickness of the first shrink-suppressing layer 13 to be larger than that of the second shrink-suppressing layer 14 to enhance the stiffness of the first shrink-suppressing layer 13.

On the other hand, as seen in a green composite laminate 51b of FIG. 7, the thickness of the second shrink-suppressing layer 14 may be set to be larger than that of the first shrink-suppressing layer 13.

In particular, when wiring conductors are arranged on the other main surface side 12b of the multilayer mother substrate 12 at a higher density than those on the one main surface side 12a, the shrink degree on the other main surface side 12b having a higher wiring density becomes higher than that on the one main surface side 12a. Thus, the first shrink-suppressing layer 13 side of the multilayer mother substrate 12 is ready to be warped into a convex shape. Thus, the warp can be suppressed by setting the thickness of the second shrink-suppressing layer 14 to be larger than that of the first shrink-suppressing layer 13 to enhance the stiffness of the second shrink-suppressing layer 14.

As understood in the above description, in this embodiment, considering the wiring density of the multilayer mother substrate 12, the thickness of the shrink-suppressing layer arranged on the side having a higher wiring density is set to be larger than that of the other shrink-suppressing layer. Thereby, the multilayer mother substrate 12 can be suppressed from warping.

The warp of the multilayer mother substrate is changed, caused by formation of the multilayer mother substrate by using different kinds of ceramic green layers, different heat distributions in the multilayer mother substrate when the substrate is fired, and so forth, in addition to unbalanced wiring densities of the multilayer mother substrate. In these cases, the multilayer mother substrate having less warp and distortion can be obtained by appropriately designing the thickness of the first shrink-suppressing layer and that of the second shrink-suppressing layer, correspondingly to the state in which the warps are generated.

<Sixth Embodiment>

Figure 8:
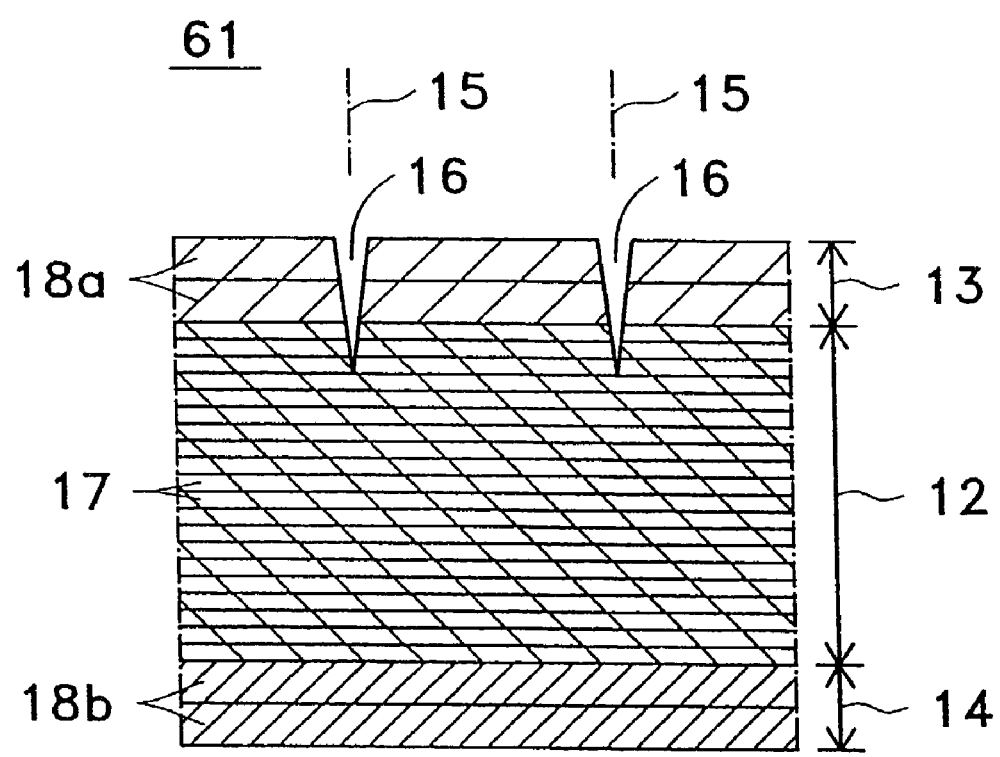
FIG. 8 is a partially enlarged cross-sectional view of a green composite laminate 61 according to a sixth embodiment of the present invention.

FIG. 8 illustrates a sixth embodiment of the present invention.

Basically, this embodiment is the same as the above-described first embodiment, excepting that in this embodiment, a sintering-difficult powder contained in the first shrink-suppressing layer 13 of a composite laminate 61 is selected as to have an average particle size larger than that of a sintering-difficult power contained in the second shrink-difficulty layer 14. That is, the first shrink-suppressing layer 13 and the second shrink-suppressing layers 14 comprise green sheets 18a and 18b which have the different average particle sizes; respectively.

Preferably, the average particle size of the sintering-difficult powder contained in the first shrink-suppressing layer 13 is not less than 1.0 $\mu$m. Preferably, the average particle size of the sintering-difficult powder contained in the second shrink-suppressing layer 14 is not more than 2.0 $\mu$m, and is smaller than that of the sintering-difficult powder contained in the first shrink-suppressing layer 13.

As described above, in the green composite laminate 11 shown in FIG. 2, the shrink degree in the vicinity of the first grooves 16 is slightly larger than that in the other part of the composite laminate 11. Thus, the multilayer mother substrate 12 tends to be warped into a concave shape. On the other hand, the constraining force of the second shrink-suppressing layer 14 becomes larger than that of the first shrink-suppressing layer 13 by setting the average particle size of the sintering-difficult powder contained in the second shrink-suppressing layer 14 to be larger than that of the sintering-difficult powder contained in the first shrink-suppressing layer 13. That is, the containing force of the first shrink-suppressing layer 13 and that of the second shrink-suppressing layer 14 can be balanced with each other by adjusting the average particle sizes of the respective shrink-suppressing layers. Thus, warp of the multilayer mother substrate 12 can be effectively suppressed.

It is to be noted that the constraining forces of the respective shrink-suppressing layers do not only depend on the average particle sizes of the sintering-difficult powders but also the kinds and gradients of the granularities, the compounding ratios, and the like of the powders. Accordingly, warp of the multilayer mother substrate 12 can be suppressed by adjusting these factors.

<Seventh Embodiment>

Basically, this embodiment is the same as the first embodiment, excepting that in this embodiment, the green composite laminate is pressed at a predetermined pressure in the lamination direction in the first process, the first grooves 16 are formed in the second process, and thereafter, the whole of the green composite laminate 11 is pressed at a higher pressure than that in the first process.

Preferably, the pressing in the first process is carried out at a surface pressure of not more than 50 MPa, and the pressing in the second process is conducted at a surface pressure of not less than 100 MPa.

If the pressure for the pressing in the first process is excessively low, the adhesion strengths between the multilayer mother substrate 12, the first shrink-suppressing layer 13, and the second shrink-suppressing layer 14 may become insufficient. On the other hand, if the pressure for the pressing in the first process is too high, cracks may be generated in the multilayer mother substrate 12 when the first grooves 16 are formed.

Thus, according to this embodiment, the above-described problems can be solved as follows. The whole of the green composite laminate 11 is temporarily pressed in the lamination direction at such a pressure that the ceramic green layers 17 can be prevented from shifting from each other, and in the second process, after the first grooves 16 are formed, the green composite laminate 11 is really pressed in the lamination direction at a pressure higher than that employed in the first process.

<Eighth Embodiment>

Figure 9:
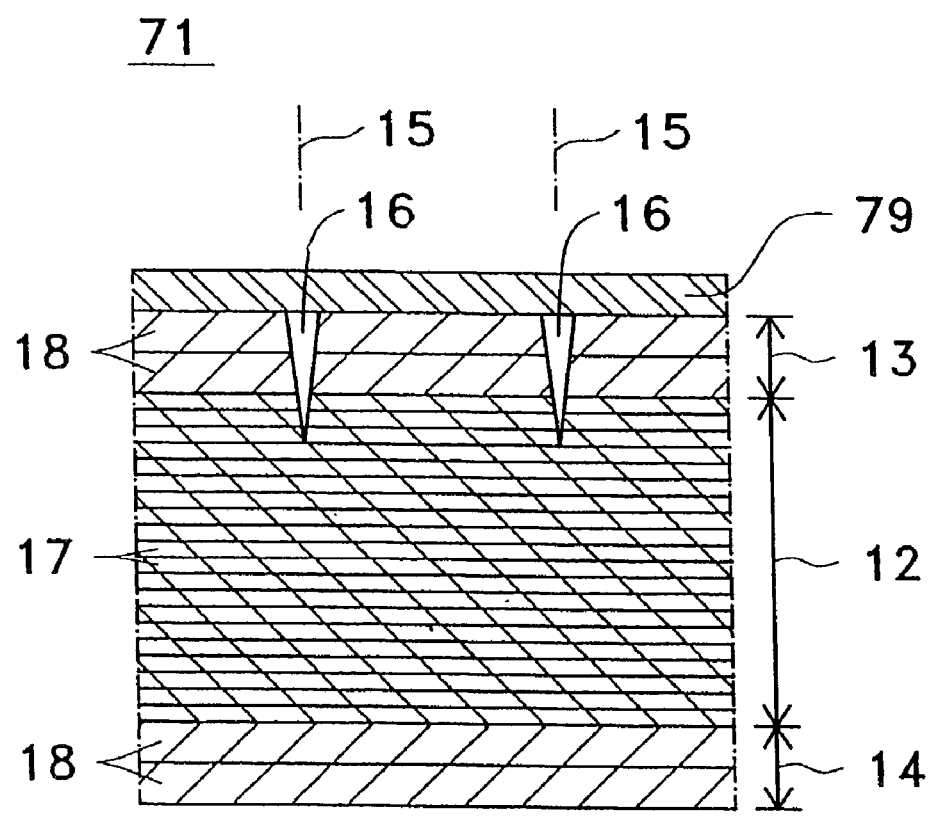
FIG. 9 is a partially enlarged cross-sectional view of a green composite laminate 71 according to an eighth embodiment of the present invention.

FIG. 9 illustrates an eighth embodiment of the present invention.

Basically, this embodiment is the same as the first embodiment, excepting that an auxiliary sheet 79 is arranged on the first shrink-suppressing layer 13 of a green composite laminate 71.

The auxiliary sheet 79 may be provided after the first grooves are formed in the second process. Especially, the whole of the composite laminate 71 is preferably pressed in the lamination direction of the ceramic green layers 17 after the auxiliary sheet 79 is provided. Preferably, the pressing may be carried At a higher pressure then that employed in the first process.

The auxiliary sheet 79 is removed together with the first shrink-suppressing layer 13 and the second shrink-suppressing layer 14 in the fourth process. The other constitutions and production manners are the same as those of the first embodiment, and the description is omitted.

The green composite laminate 11 shown in FIG. 2, after the second process, is carried into a baking furnace or the like to be subjected to the third process. However, it is supposed that the green composite laminate 11 is bent while the green composite laminate 11 is being transported, so that stress is applied to the first grooves 16, resulting in formation of cracks in the multilayer mother substrate 12. The auxiliary sheet 79 is provided aiming at suppressing the bending.

The auxiliary sheet 79 needs to have an adequate adhesion strength for the first shrink-suppressing layer 13. Thus, for example, the auxiliary sheet 79 comprises ceramic green sheets or the like.

Preferably, the auxiliary sheet 79, same as the first shrink-suppressing layer 13 and second shrink-suppressing layer 14, contains a sintering-difficult powder incapable of being sintered at the sintering temperature of the ceramic powder contained in the ceramic green layers 17. For example, the auxiliary sheet 79 may comprise the same green sheet 18 as constitutes the first shrink-suppressing layer 13. In this case, the auxiliary sheet 79 functions as a third shrink-suppressing layer and can more effectively suppress the multilayer mother substrate 12 from warping into a concave shape.

EXAMPLES

Hereinafter, specific examples of the present invention will be described.

Example 1

To identify the effects of the second embodiment shown in FIG. 3, the following experiment was carried out.

Crystallized glass powder prepared by mixing respective powders of $SiO_2$, $Al_2O_3$, $B_2O_3$, and CaO, and alumina powder were mixed at an equal weight ratio. To 100 parts by weight of the mixed powder, 15 parts by weight of polyvinylbutyral, 40 parts by weight of isopropyl alcohol, and 20 parts by weight of toluene were added, and mixed for 24 hours by means of a ball mill to form slurry.

Subsequently, the slurry was formed into a sheet by a doctor blade method. Thus, a ceramic sheet with a thickness of 120 μm useful for a multilayer mother substrate was formed, and cut to a square having a plan size of 135 mm×135 mm The sintering temperature of the ceramic powder contained in the ceramic green sheet was 850° C.

Separately, to 100 parts by weight of zirconium oxide powder, 15 parts by weight of polyvinylbutyral, 40 parts by weight of isopropyl alcohol, and 20 parts by weight of toluene were added, and mixed for 24 hours by means of a ball mill to form a slurry.

Next, the slurry was formed into a sheet by the doctor blade method. Thus, a ceramic sheet with a thickness of 120 μm useful for a shrink-suppressing layer was formed, and cut to a square having a size viewed in the plan of 135 mm×135 mm. The sintering temperature of the zirconium oxide powder contained in the ceramic green sheet useful for the shrink-suppressing layer was 1600° C.

Next, six ceramic green sheets useful for a multilayer mother substrate were laminated to each other to form the multilayer mother substrate. Two green sheets useful for the shrink-suppressing layer were laminated onto one main surface and the other main surface of the multilayer mother substrate, respectively. Thus, the first shrink-suppressing layer and the second shrink-suppressing layer were formed, respectively, to obtain a green composite laminate. Furthermore, the green composite laminate was pressed in the lamination direction at a plane pressure of 20 MPa and a temperature of 60° C. In this embodiment, no wiring conductors were formed for conveniences.

Subsequently, a cutter knife was pressed against one main surface of the obtained composite laminate. Thus, first grooves having a V-shaped cross section and a depth of 350 μm were formed in a grating pattern so as to pass through the first shrink-suppressing layer and reach the multilayer mother substrate. The intervals between neighboring first grooves were set at 20 mm. That is, the total number of the first grooves formed in the first shrink-suppressing layer was twelve.

Three green composite laminates having the above-described first grooves were prepared.

Then, a cutter knife was pressed against the second shrink-suppressing layer of a first composite laminate in such a manner that the top of the cutter knife lies in the second shrink-suppressing layer. Thus, the second grooves having a depth of 100 μm and a V-shaped cross section, respectively, were formed in a grating pattern. The intervals between neighboring second grooves were set at 20 mm. That is, the total number of the second grooves in the second shrink-suppressing layer was 12. The composite laminate formed as described above was designated by $L_1$, and the multilayer mother substrate contained in the composite laminate $L_1$ was designated by $S_1$.

Next, a cutter knife was pressed against the second shrink-suppressing layer of a second composite laminate in such a manner that the top of the cutter knife lies in the second shrink-suppressing layer. Thus, the second grooves having a depth of 100 μm and a V-shaped cross section, respectively, were formed in a grating pattern. The intervals between neighboring second grooves were set at 15 mm. That is, the total number of the second grooves in the second shrink-suppressing layer was 16. The composite laminate formed as described above was represented by $L_2$, and the multilayer mother substrate contained in the composite laminate $L_2$ was represented by $S_2$.

Finally, in a third composite laminate, no second grooves were formed in the second shrink-suppressing layer. The composite laminate produced as described above was designated by $L_3$, and the multilayer mother substrate contained in the composite laminate $L_3$ was designated by $S_3$.

Subsequently, the composite laminates $L_1$ to $L_3$ were placed on a tray made of an alumina plate having a warp amount per unit length in the surface direction of not more than 0.05% and a porosity of 70%, heated for 3 hours at 600° C. for binder-removing treatment, and fired at 900° C. for one hour in the air. Thereafter, the multilayer mother substrates $S_1$ to $S_3$ were sintered.

Next, the shrink-suppressing layers remaining on both of the main surfaces of each sintered multilayer mother substrate were removed by means of a brush. Then, the multilayer mother substrates $S_1$ to $S_3$ were recovered.

The maximum warp amounts per unit length in a particular direction of these multilayer mother substrates $S_1$ to $S_3$ were measured. The maximum warp amounts were 0.10% for the multilayer mother substrate $S_1$, 0.08% for the multilayer mother substrate $S_2$, and 0.70% for the multilayer mother substrate $S_3$.

As described above, the warp and distortion of the multilayer mother substrate can be designed so as to have desired degrees by forming the second grooves in the composite laminate. In other words, the warp and distortion of the multilayer assemble substrate can be effectively suppressed.

Example 2

The following experiment was carried out to identify the effects of the fifth embodiment shown in FIGS. 6 and 7.

First, similarly to Example 1, ceramic green sheets useful for a multilayer mother substrate and green sheets useful for shrink-suppressing layers, each of the sheets having a thickness of 120 μm and a size viewed in the plan of 135 mm×135 mm, were prepared.

Next, six ceramic green sheets for the multilayer mother substrate were laminated to each other to form a green multilayer mother substrate. Two green sheets for the shrink-suppressing layers were laminated onto the one main surface and the other main surface of the green multilayer mother substrate, respectively, so that the first shrink-suppressing layer and the second shrink-suppressing layer were formed. Thus, the green composite laminate was obtained.

Figure 10:
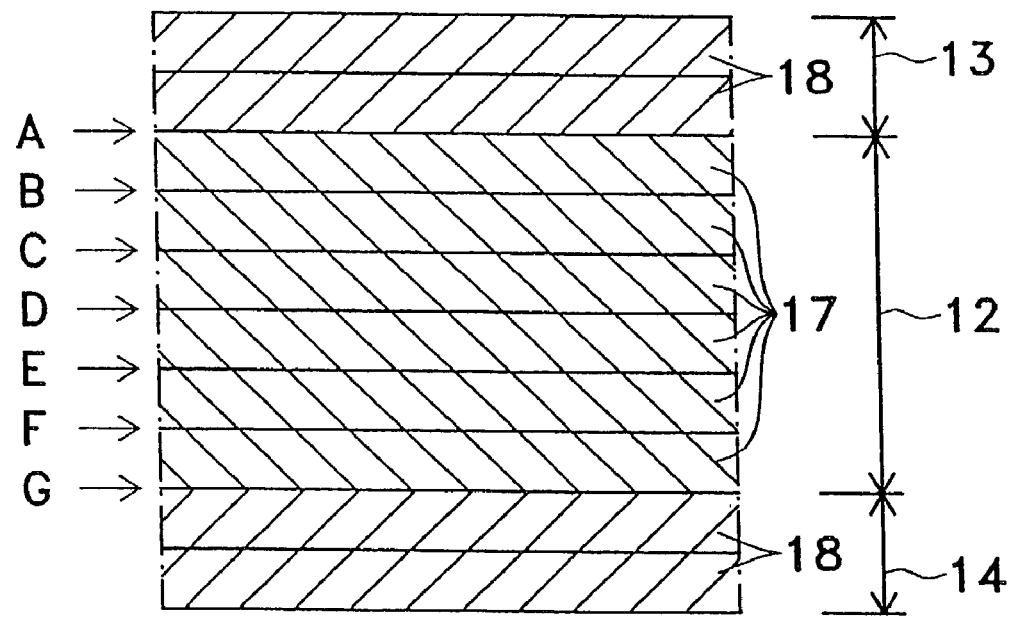
FIG. 10 is a partially enlarged cross-sectional view of a green composite laminate 51 before the formation of first grooves according to the second embodiment of the present invention.

In this embodiment, a wiring conductor was formed on at least one ceramic green sheet for the multilayer mother substrate. As shown in FIG. 10 and in Table 1 prepared below, the composite laminates $L_{11}$ to $L_{13}$ were produced with the formation positions of wiring conductors being changed. Moreover, a composite laminate $L_{11}$ having no wiring conductors was formed, in addition to the composite laminates $L_{11}$ to $L_{13}$.

Here, FIG. 10 is a cross sectional view of a green composite laminate before the grooves are formed. A composite laminate 51 comprises the multilayer mother substrate 12, and the first shrink-suppressing layer 13 and the second shrink-suppressing layer 14 formed on the one main surface and the other main surface thereof, respectively. The multilayer mother substrate 12 comprises six laminated ceramic green sheets 17. The first shrink-suppressing layer 13 and the second shrink-suppressing layer 14 comprise two laminated green sheets 18 for the shrink-suppressing layers, respectively, which have the same compositions. In FIG. 10, position A represents one main surface of the multilayer mother substrate 12. Position G indicates the other main surface of the multilayer mother substrate 12. Positions B to F represent the interfaces of the layers of the multilayer mother substrate 12, respectively.

As described in Table 1, the composite laminate $L_{11}$ contains wiring conductors in the positions A and B. The composite laminate $L_{12}$ contains wiring conductors in the position F. The composite laminate $L_{13}$ contains wiring conductors in the positions E, F, and G.

TABLE 1

| Green composite laminate | Position of wiring conductor in FIG. 10 | Number of green sheets | |
|---|---|---|---|
| | | First shrink-suppressing layer | Second shrink-suppressing layer |
| $L_{11}$ | A, B | 2 | 2 |
| $L_{12}$ | F | 2 | 2 |
| $L_{13}$ | E, F, G | 2 | 2 |
| $L_{14}$ | No wiring conductor | 2 | 2 |

Figure 11:
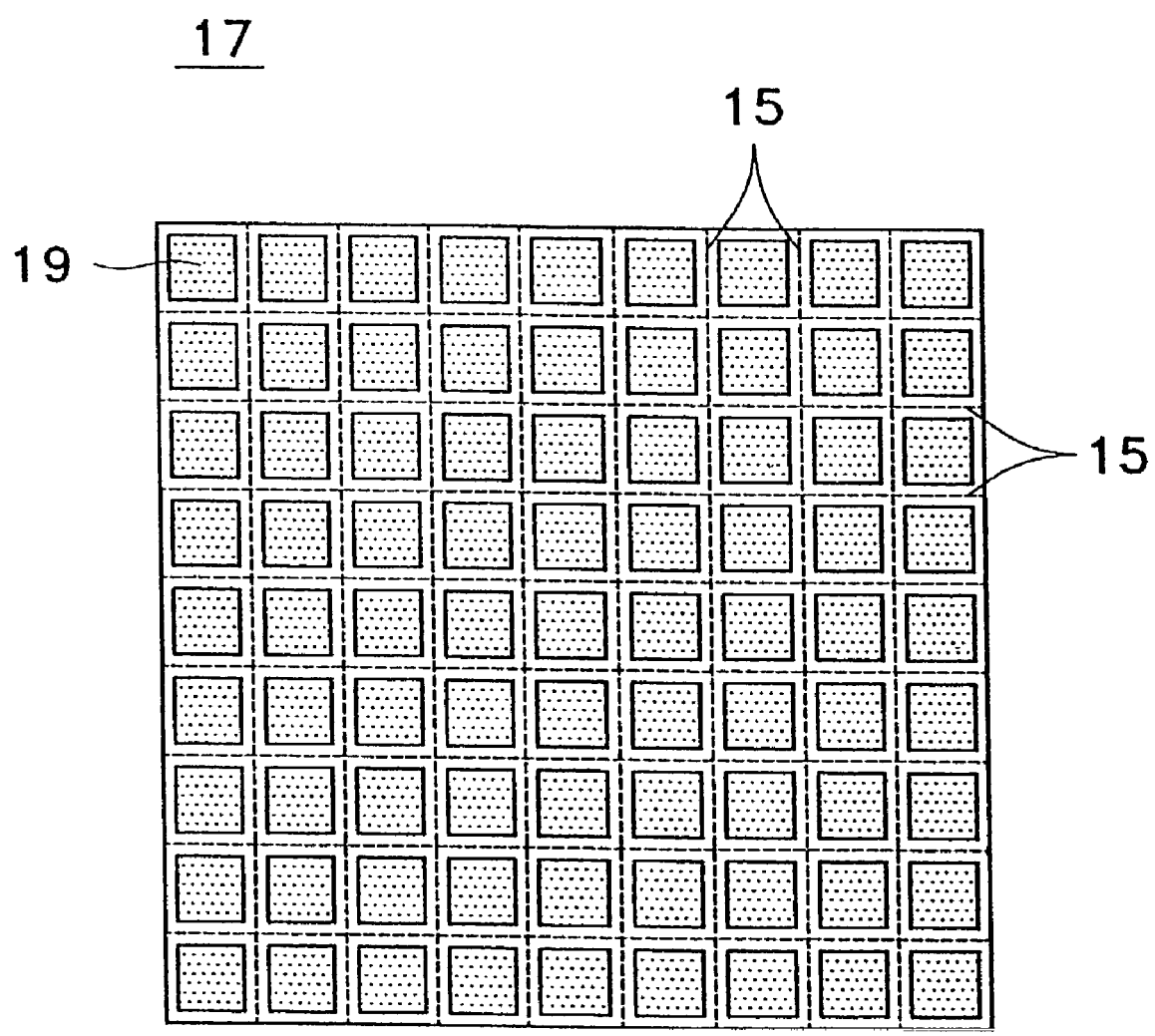
FIG. 11 is a plan view of a green sheet 17 having wiring conductors according to the second embodiment of the present invention.
Figure 12:
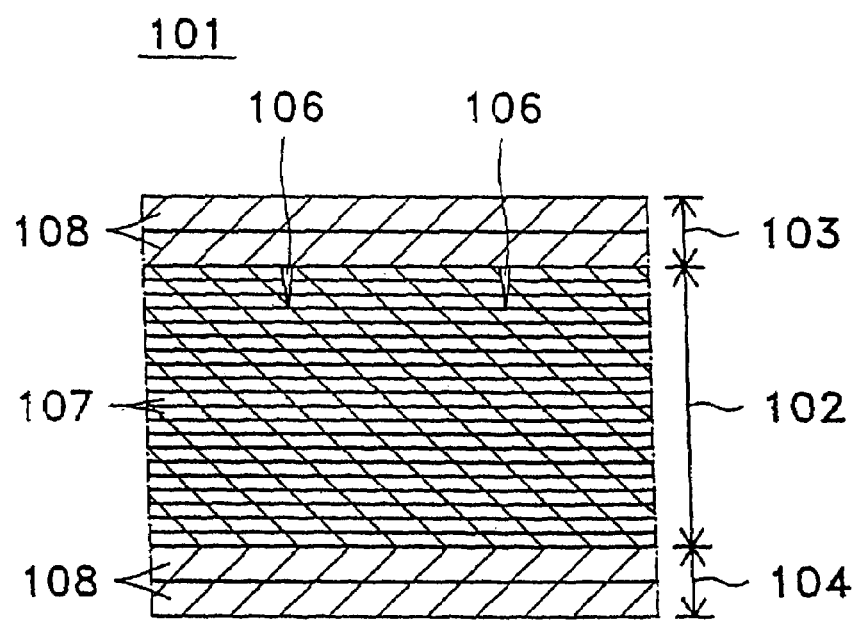
FIG. 12 is a cross-sectional view of a conventional green composite laminate 101.

The wiring conductors were formed by screen-printing Cu paste onto the ceramic green sheets useful for the multilayer mother substrate. FIG. 11 is a plan view showing the state in which the wiring conductors were formed on the ceramic green sheet. In this embodiment, the ceramic green sheet 17 having a size of 135×135 mm was divided along the dividing lines 15 into sections having a size of 15 mm×15 mm. Wiring conductors 19 each having a size of 13 mm×13 mm and a thickness of 6 μm were formed in the centers of the sections, respectively.

Next, the composite laminates $L_{11}$ to $L_{14}$ were pressed in the lamination direction under the conditions of a surface pressure of 20 Mpa and a temperature of 60° C., respectively. Subsequently, a cutter knife was pressed against each of the composite laminates $L_{11}$ to $L_{14}$ from the first shrink-suppressing layer so as to pass through the first shrink-suppressing layer and reach the multilayer mother substrate. Thus, first grooves having a depth of 350 μm and a V-shaped cross section were formed in a grating pattern. The intervals between neighboring first grooves were set at 15 mm.

Subsequently, similarly to Example 1, the composite laminates $L_{11}$ to $L_{14}$ were heated so that the multilayer mother substrates of the composite laminates were sintered. The shrink-suppressing layers remaining on both of the main surfaces of each sintered multilayer mother substrate were removed by means of a brush. Thus, the sintered multilayer mother substrates $S_{11}$ to $S_{14}$ were obtained.

Thus, the maximum warp amounts (%) per unit length in a particular direction of the multilayer mother substrate $S_{11}$ to $S_{14}$ obtained from the composite laminates $L_{11}$ to $L_{14}$ were measured. The results were shown in the following Table 2.

TABLE 2

| Multilayer mother substrate | Shape of warp | Maximum warp amount per unit length (%) |
|---|---|---|
| $S_{11}$ | concave | 0.08 |
| $S_{12}$ | concave | 0.04 |
| $S_{13}$ | convex | 0.05 |
| $S_{14}$ | concave | 0.10 |

Subsequently, composite laminates $L_{21}$ to $L_{24}$ useful for the shrink-suppressing layers shown in the following Table 3 were produced, adjusting the number of the green sheets for the respective shrink-suppressing layers. Basically, the method of producing the composite laminates $L_{21}$ to $L_{24}$ are the same as that for producing the composite laminates $L_{11}$ to $L_{14}$.

TABLE 3

| Green composite laminate | Position of wiring conductor in FIG. 10 | Number of green sheets | |
|---|---|---|---|
| | | First shrink-suppressing layer | Second shrink-suppressing layer |
| $L_{21}$ | A, B | 4 | 2 |
| $L_{22}$ | F | 3 | 2 |
| $L_{23}$ | E, F, G | 2 | 3 |
| $L_{24}$ | No wiring conductor | 4 | 2 |

The composite laminate $L_{21}$ is produced by further laminating one green sheet useful for a shrink-suppressing layer onto the second shrink-suppressing layer composite laminate $L_{11}$. The composite laminate $L_{22}$ is produced by further laminating one green sheet useful for a shrink-suppressing layer onto the second shrink-suppressing layer of the composite laminate $L_{12}$. The composite laminate $L_{23}$ is produced by further laminating one green sheet useful for a shrink-suppressing layer onto the first shrink-suppressing layer of the composite laminate $L_{13}$. The composite laminate L24 is produced by further laminating two green sheets useful for a shrink-suppressing layer onto the first shrink-suppressing layer of the composite laminate L14.

For the composite laminates $L_{21}$ and $L_{24}$, the depth of the first grooves was set at 590 µm, correspondingly to the increased thickness of the fist shrink-suppressing layer. Moreover, for the composite laminate $L_{22}$, the depth of the first grooves was set at 470 µm.

Subsequently, similarly to Example 1, the composite laminates $L_{21}$ and $L_{24}$ were heated so that the multilayer mother substrates of the composite laminates were sintered. Thereafter, the shrink-suppressing layers remaining on both of the main surfaces of the sintered multilayer mother substrates were removed by means of a brush. Thus, the multilayer mother substrates $S_{21}$ to $S_{24}$ were obtained.

Next, the maximum warp amounts (%) per unit length in a particular direction of the multilayer mother substrates $S_{21}$ to $S_{24}$ were measured. The following Table 4 shows the results.

TABLE 4

| Multilayer mother substrate | Shape of warp | Maximum warp amount per unit length (%) |
|---|---|---|
| $S_{21}$ | convex | 0.01 |
| $S_{22}$ | concave | 0.01 |
| $S_{23}$ | concave | 0.01 |
| $S_{24}$ | concave | 0.02 |

As seen in Tables 3 and 4, the warp and distortion of the multilayer mother substrate of a composite laminate can be designed so as to have desired degrees by forming the first shrink-suppressing layer and the second shrink-suppressing layer so as to have different thicknesses. In other words, the warp and distortion of the multilayer mother substrate can be effectively suppressed.

Example 3

The following experiment was carried out to identify the effects of the seventh embodiment shown in FIG. 8.

First, similarly to Example 1, a ceramic green sheet having a thickness of 120 µm and a size viewed in the plan of 135 mm×135 mm useful for a multilayer mother substrate was produced.

On the other hand, as the sintering-difficulty power useful for the shrink-suppressing layers, alumina powders having average particle sizes of 0.5 µm, 1.0 µm, 2.0 µm, and 2.5 µm were prepared, respectively. Subsequently, 15 parts by weight of polyvinybutyral, 40 parts by weight of isopropyl alcohol, and 20 parts by weight of toluene were added to 100 parts by weight of each alumina powder, and mixed for 24 hours by means of a ball mill to form slurry. Next, the slurry was formed into a sheet by a doctor blade method. Then, a green sheet useful for the shrink-suppressing layers, having a thickness of 120 µm was formed, and cut to have a size viewed in the plan of 135 mm×135 mm. Thus, four types of the green sheets useful for the shrink-suppressing layers were produced. The sintering temperatures of the alumina powders contained in these sheets sere about 1600° C., although slight differences exist between the temperatures.

Next, six ceramic green sheets useful for a multilayer mother substrate were laminated. Thus, the multilayer mother substrate was formed. Two green sheets useful for the shrink-suppressing layers were laminated onto one main surface and the other main surface of the substrate, respectively, to form the first shrink-suppressing layer and the second shrink-suppressing layer. Thus, a green composite laminate was obtained. In this case, composite laminates $L_{31}$ and $L_{32}$ were produced in which different kinds of green sheets useful for shrink-suppressing layers were used in the first shrink-suppressing layer and the second shrink-suppressing layer. Simultaneously, a composite laminate $L_{33}$ was produced in which the same green sheets useful for shrink-suppressing layers were used in the first shrink-suppressing layer and the second shrink-suppressing layer. It is to be noted that in this Example, nor wiring conductors were not used.

For the composite laminate $L_{31}$, as the green sheet useful for shrink-suppressing layers which constitutes the first shrink-suppressing layer, one containing alumina powder with an average particle size of 1.0 μm was used. As the green sheet useful for the second shrink-suppressing layer, one containing an alumina powder with an average particle size of 0.5 μm was employed.

For the composite laminate $L_{32}$, as the green sheet useful for shrink-suppressing layers which constitutes the first shrink-suppressing layer an alumina powder with an average particle size of 2.5 μm was used, and also as the green sheet useful for shrink-suppressing layers which constitutes the second shrink-suppressing layer, an alumina powder with an average particle size of 2.0 μm was employed.

For the composite laminate $L_{33}$, as the green sheets useful for shrink-suppressing layers which constitutes the first shrink-suppressing layer and the second shrink-suppressing layer, an alumina powder with an average particle size of 0.5 μm was employed.

Next, the composite laminates $L_{31}$ to $L_{33}$ were pressed at a surface pressure of 50 MPa and a temperature of 60° C., respectively. Then, a cutter knife was pressed from the first shrink-suppressing layer side of each of the composite laminates $L_{31}$ to $L_{33}$ so as to pass through the first shrink-suppressing layer and reach the multilayer mother substrate. Thus, first grooves having a depth of 350 μm and a V-shaped cross section were formed in a grating pattern. The intervals between neighboring first grooves were set at 15 mm.

Next, similarly to Example 1, the composite laminates $L_{31}$ to $L_{33}$ were heated, so that the multilayer mother substrates in the composite laminates were sintered. The shrink-suppressing layers remaining on both of the main surfaces of the sintered multilayer mother substrate were removed by means of a brush. Thus, the multilayer mother substrates $S_{31}$ to $S_{33}$ were obtained.

The maximum warp amounts per unit length in a particular direction of these multilayer mother substrates $S_{31}$ to $S_{33}$ were measured. The maximum warp amounts per unit length were 0.10% for the multilayer mother substrate $S_{31}$, 0.12% for the multilayer mother substrate $S_{32}$, and 0.70% for the multilayer mother substrate $S_{33}$.

As seen in the above-description, the warp and distortion of a multilayer mother substrate can be designed so as to have desired degrees by setting the average particle size of the alumina powder in the first shrink-suppressing layer of the composite laminate so as to be larger than the average particle size of the alumina powder in the second shrink-suppressing layer. In other words, the warp and distortion of the multilayer mother substrate can be effectively suppressed.

Example 4

The following experiment was carried out to identify the effects of the eighth embodiment.

First, similarly to Example 1, ceramic green sheets useful for a multilayer mother substrate and green sheets useful for shrink-suppressing layers each having a thickness of 120 μm and a size viewed in the plan of 135 mm×135 mm were formed.

Next, six ceramic green sheets useful for a multilayer mother substrate were laminated to form a multilayer mother substrate. Two green sheet useful for the shrink-suppressing layers were laminated onto one main surface and the other main surface thereof, respectively. Thus, the first shrink-suppressing layer and the second shrink-suppressing layer were formed. That is, a green composite laminate was obtained. In this Example, no wiring conductors were formed for convenience.

Next, the green composite laminate was pressed at a surface pressure of 50 Mpa and a temperature of 60° C.

Subsequently, a cutter knife was pressed from the first shrink-suppressing layer side so as to pass through the first shrink-suppressing layer and reach the multilayer mother substrate. Thus, first grooves having a depth of 350 μm and a V-shaped cross section were formed in a grating pattern. The intervals between neighboring grooves were set at 20 mm.

Three green composite laminates having the first grooves formed as described above were prepared.

A first green composite laminate was pressed again at a surface pressure of 60 MPa and a temperature of 60° C. The composite laminate formed as described above was named a composite laminate $L_{41}$.

A second green composite laminate was pressed again at a surface pressure of 100 MPa and a temperature of 60° C. The composite laminate formed as described above was named a composite laminate $L_{42}$.

Finally, a third green composite laminate was not pressed, and was named a composite laminate $L_{43}$ as it was.

Next, the maximum warp amounts per unit length in a particular direction of the multilayer mother substrates $S_{41}$ to $S_{43}$, and dispersions of the intervals between neighboring first grooves of the multilayer mother substrates $S_{41}$ to $S_{43}$ were measured. The following Table 5 shows the results.

TABLE 5

| Multilayer mother substrate | Surface pressure at pressing of composite laminate (MPa) First notch | | Maximum warp amount per unit length (%) | Dispersion of interval between first grooves (%) |
|---|---|---|---|---|
| | before formation | after formation | | |
| $S_{41}$ | 50 | 60 | 0.12 | ±0.05 |
| $S_{42}$ | 50 | 100 | 0.10 | ±0.05 |
| $S_{43}$ | 50 | — | 0.70 | ±1.0 |

As seen in Table 5, the warp and distortion of a multilayer mother substrate can be designed so as to have desired degrees by forming the first grooves after the temporary pressing, and thereafter, further pressing the composite laminate. In other words, the warp and distortion of the multilayer mother substrate can be effectively suppressed.

Industrial Applicability

As described above, the method of producing ceramic multilayer substrates of the present invention is useful as methods of producing a variety of ceramic multilayer substrates such as substrates for mounting semiconductor devices, and so forth.

What is claimed is:
1. A method of producing ceramic multilayer substrates comprising:
   (1) providing a green composite laminate comprising a green multilayer mother substrate having first and second opposing main surfaces and comprising a plurality of ceramic green layers containing ceramic powder, and first and second shrink-suppressing layers on the first and second main surfaces of the mother substrate, respectively, wherein the first and second shrink-suppressing layers comprise a powder substantially incapable of being sintered under the sintering conditions for the ceramic powder of the green multilayer mother substrate;

(2) forming a plurality of first grooves extending from the first shrink-suppressing layer side so as to pass through the first shrink-suppressing layer and reach a part of the green multilayer mother substrate;

(3) firing the green composite laminate under the sintering conditions for the ceramic powder;

(4) removing the first and second shrink-suppressing layers to recover a sintered multilayer mother substrate, and (5) dividing the multilayer mother substrate along the first grooves to realize a plurality of ceramic multilayer substrates, wherein at least one of (a) the first shrink-suppressing layer and the second shrink-suppressing layer have different thicknesses (b) the powders in the first and second shrink-suppressing layers have different average particles sizes and (c) the provided green composite laminate has wiring conductors disposed on the first and second main surfaces and the density of the wiring conductors on those main surfaces is different, is satisfied.

2. The method of producing ceramic multilayer substrates according to claim 1, wherein the whole of the green composite laminate is pressed in the lamination direction of the ceramic green layers prior to formation of the first grooves.

3. The method of producing ceramic multilayer substrates according to claim 2, further comprising A method of producing ceramic multilayer substrates comprising:

(1) providing a green composite laminate comprising a green multilayer mother substrate having first and second opposing main surfaces and comprising a plurality of ceramic green layers containing ceramic powder, and first and second shrink-suppressing layers on the first and second main surfaces of the mother substrate, respectively, wherein the first and second shrink-suppressing layers comprise a powder substantially incapable of being sintered under the sintering conditions for the ceramic powder of the green multilayer mother substrate;

(2) the whole of the green composite laminate is pressed in the lamination direction of the ceramic green layers;

(3) forming in the pressed laminate a plurality of first grooves extending from the first shrink-suppressing layer side so as to pass through the first shrink-suppressing layer and reach a part of the green multilayer mother substrate;

(3) forming a plurality of second grooves in the second shrink-suppressing layer from the second shrink-suppressing layer side;

(4) after forming the second grooves, firing the green composite laminate under the sintering conditions for the ceramic powder;

(5) removing the first and second shrink-suppressing layers to recover a sintered multilayer mother substrate, and (6) dividing the multilayer mother substrate along the first grooves to realize a plurality of ceramic multilayer substrates;

wherein (a) the second grooves are formed in such a manner that the second grooves do not extend into the green composite laminate or (b) the number of the second grooves is larger than that of the first grooves or (c) both (a) and (b).

4. The method of producing ceramic multilayer substrates according to claim 3, wherein the second grooves are formed in such a manner that the second grooves do not extend into the green composite laminate.

5. The method of producing ceramic multilayer substrates according to claim 4, wherein the second grooves are formed so as to cross at an angle with respect to the first grooves.

6. The method of producing a ceramic multilayer substrate according to claim 3, wherein the number of the second grooves is larger than that of the first grooves.

7. The method of producing ceramic multilayer substrates according to claim 3, wherein the second grooves are formed so as to extend through the second shrink-suppressing layer and reach a part of the multilayer mother substrate.

8. The method of producing ceramic multilayer substrates according to claim 7, wherein the second grooves are formed in the positions opposite to the first grooves.

9. The method of producing ceramic multilayer substrates according to claim 1, wherein the first shrink-suppressing layer and the second shrink-suppressing layer have different thicknesses.

10. The method of producing ceramic multilayer substrates according to claim 9, wherein the first shrink-suppressing layer has a thickness larger than that of the second shrink-suppressing layer.

11. The method of producing ceramic multilayer substrates according to claim 1, wherein the powder contained in the first shrink-suppressing layer and the powder contained in the second shrink-suppressing layer have different average particle sizes.

12. The method of producing ceramic multilayer substrates according to claim 11, wherein the powder contained in the first shrink-suppressing layer has an average particle size larger than that of the powder contained in the second shrink-suppressing layer.

13. The method of producing ceramic multilayer substrates according to claim 12, wherein the powder contained in the first shrink-suppressing layer has an average particle size of 1 $\mu$m or more, and the powder contained in the second shrink-suppressing layer has an average particle size of 2 $\mu$m or less.

14. The method of producing ceramic multilayer substrates according to claim 2, further comprising forming the green composite laminate by pressing an assembly of the green mother substrate and first and second shrink-suppressing layers.

15. The method of producing a ceramic multilayer substrate according to claim 14, further comprising arranging wiring conductors between the ceramic green sheets before pressing to form the green composite laminate.

16. A method of producing ceramic multilayer substrates comprising:

(1) forming a green composite laminate comprising a green multilayer mother substrate having first and second opposing main surfaces and comprising a plurality of ceramic green layers containing ceramic powder, and first and second shrink-suppressing layers on the first and second main surfaces of the mother substrate, respectively, wherein the first and second shrink-suppressing layers comprise a powder substantially incapable of being sintered under the sintering conditions for the ceramic powder of the green multilayer mother substrate, by pressing an assembly of the green mother substrate and first and second shrink-suppressing layers;

(2) pressing the whole of the green composite laminate in the lamination direction of the ceramic green layers;

(3) forming in the pressed laminate a plurality of first grooves extending from the first shrink-suppressing layer side so as to pass through the first shrink-suppressing layer and reach a part of the green multilayer mother substrate;

(3) firing the green composite laminate under the sintering conditions for the ceramic powder;

(4) removing the first and second shrink-suppressing layers to recover a sintered multilayer mother substrate, and (5) dividing the multilayer mother substrate along the first grooves to realize a plurality of ceramic multilayer substrates;

wherein the formed composite laminate is pressed at a pressure higher than that employed in forming the composite laminate.

17. The method of producing ceramic multilayer substrates according to claim 16, wherein the pressing in the formation of the laminate is carried out at a surface pressure of 50 MPa or less, and the pressing of the formed laminate is carried out at a surface pressure of 100 MPa or more.

18. The method of producing ceramic multilayer substrates according to claim 2, further comprising providing an auxiliary sheet on the first shrink-suppressing layer after the first grooves are formed and pressing the resulting assembly thereafter, followed by removing the auxiliary sheet.

19. A method of producing ceramic multilayer substrates comprising:

(1) forming a green composite laminate comprising a green multilayer mother substrate having first and second opposing main surfaces and comprising a plurality of ceramic green layers containing ceramic powder, and first and second shrink-suppressing layers on the first and second main surfaces of the mother substrate, respectively, wherein the first and second shrink-suppressing layers comprise a powder substantially incapable of being sintered under the sintering conditions for the ceramic powder of the green multilayer mother substrate, by pressing an assembly of the green mother substrate and first and second shrink-suppressing layers;

(2) pressing the whole of the green composite laminate in the lamination direction of the ceramic green layers;

(3) forming in the pressed green laminate a plurality of first grooves extending from the first shrink-suppressing layer side so as to pass through the first shrink-suppressing layer and reach a part of the green multilayer mother substrate;

(4) providing an auxiliary sheet on the first shrink-suppressing layer after the first grooves are formed and pressing the green composite laminate in the lamination direction of the ceramic green layers after the auxiliary sheet is provided is at a higher pressure than that employed in forming the green composite, followed by removing the auxiliary sheet;

(5) firing the green composite laminate under the sintering conditions for the ceramic powder;

(6) removing the first and second shrink-suppressing layers to recover a sintered multilayer mother substrate, and (7) dividing the multilayer mother substrate along the first grooves to realize a plurality of ceramic multilayer substrates.

20. The method of producing ceramic multilayer substrates according to claim 1, the provided green composite laminate has wiring conductors disposed on the first and second main surfaces, wherein the density of the wiring conductors on those main surfaces is different.

* * * * *